United States Patent
Ikedo

(10) Patent No.: US 8,243,854 B2
(45) Date of Patent: Aug. 14, 2012

(54) AMPLITUDE CONTROL CIRCUIT, POLAR MODULATION TRANSMISSION CIRCUIT AND POLAR MODULATION METHOD

(75) Inventor: Taichi Ikedo, Kanagawa (JP)

(73) Assignee: Panasonic Corporation, Osaka (JP)

( * ) Notice: Subject to any disclaimer, the term of this patent is extended or adjusted under 35 U.S.C. 154(b) by 676 days.

(21) Appl. No.: 12/425,739

(22) Filed: Apr. 17, 2009

(65) Prior Publication Data

US 2009/0262863 A1   Oct. 22, 2009

(30) Foreign Application Priority Data

Apr. 18, 2008  (JP) ................................ 2008-109288

(51) Int. Cl.
    *H04L 27/04* (2006.01)
(52) U.S. Cl. ...................................... 375/300; 375/295
(58) Field of Classification Search .................. 375/295, 375/300
    See application file for complete search history.

(56) References Cited

U.S. PATENT DOCUMENTS

| 2006/0009169 A1 | 1/2006 | Arayashiki |
| 2007/0212081 A1 | 9/2007 | Takahashi |
| 2007/0297530 A1 * | 12/2007 | Maeda et al. ................. 375/295 |

FOREIGN PATENT DOCUMENTS

| JP | 02-146194 | 6/1990 |
| JP | 06-216772 | 8/1994 |
| JP | 2004-266351 | 3/2005 |
| JP | 2007-243510 | 9/2007 |
| WO | 2007-148753 | 12/2007 |

OTHER PUBLICATIONS

International Search Report dated May 19, 2009.

* cited by examiner

*Primary Examiner* — Shuwang Liu
*Assistant Examiner* — Nader Bolourchi
(74) *Attorney, Agent, or Firm* — Dickinson Wright PLLC

(57) ABSTRACT

The amplitude control circuit of the present invention can reduce output noise and suppress a decrease in reception sensitivity. An amplitude control section (120), which is an amplitude control circuit, is provided with: a DA converter (121) that converts amplitude data into differential amplitude signals and outputs the differential amplitude signals; a level control section (122) that controls the levels of the differential amplitude signals according to transmission power information P; and an offset calculating section (123) that assigns the DC voltage based upon transmission power information P to the differential amplitude signals subjected to level control in the level control section (122).

4 Claims, 10 Drawing Sheets

US 8,243,854 B2

AMPLITUDE CONTROL CIRCUIT, POLAR MODULATION TRANSMISSION CIRCUIT AND POLAR MODULATION METHOD

CROSS REFERENCE TO RELATED APPLICATIONS

The disclosure of Japanese Patent Application No. 2008-109288, filed on Apr. 18, 2008, including the specification, drawings and abstract, is incorporated herein by reference in its entirety.

BACKGROUND OF THE INVENTION

1. Field of the Invention

The present invention relates to an amplitude control circuit, polar modulation transmission circuit and polar modulation method used in mobile telephones and communication devices using wireless LAN and such. In particular, the present invention relates to an amplitude control circuit, polar modulation transmission circuit and polar modulation method that operate with high efficiency and low distortion.

2. Description of the Related Art

Mobile telephones and communication devices using wireless LAN and such are required to ensure linear characteristics of transmission signals over a wide range of output levels and still operate with low power consumption. Further, a transmission circuit that operates with high efficiency and low distortion is used in such communication devices. A conventional transmission circuit will be explained below.

As a conventional transmission circuit, for example, there is a transmission circuit to generate transmission signals utilizing a modulation scheme such as quadrature modulation (hereinafter "quadrature modulation circuit"). Here, the quadrature modulation circuit is widely known and explanation will be omitted. Further, as a conventional transmission circuit to output transmission signals with higher efficiently and higher linearity than a quadrature modulation circuit, for example, there is the transmission circuit disclosed in Patent Document 1. FIG. 1 is a block diagram showing a sample configuration of conventional transmission circuit 10 disclosed in Patent Document 1. Referring to FIG. 1, conventional transmission circuit 10 is provided with amplitude phase extracting section 11, amplitude control section 12, phase modulating section 13, amplification section 14 and output terminal 15.

Amplitude phase extracting section 11 extracts amplitude data and phase data from input data. The amplitude data is inputted in amplitude control section 12. Amplitude control section 12 provides the voltage based on the amplitude data to amplification section 14. Further, the phase data is inputted in phase modulating section 13. Phase modulating section 13 performs phase modulation based on the input phase data and outputs the result as a phase modulation signal. The phase modulation signal is inputted in amplification section 14. Amplification section 14 amplifies the phase modulation signal according to the voltage provided from amplitude control section 12. The signal amplified in amplification section 14 is outputted as a transmission signal from output terminal 15. The output level of the transmission signal can be controlled by changing the output voltage of amplitude control section 12 and providing the resulting output voltage to amplification section 14. Thus, a scheme for dividing input data into amplitude data and phase data and performing modulation using these data, is referred to as "polar modulation scheme" or "polar coordinate modulation scheme." Further, transmission circuit 10 that implements this scheme is referred to as "polar modulation circuit (or polar coordinate circuit)".

Patent Document 1: Japanese Patent Application Laid-Open No. 2004-266351 (FIG. 9)

However, conventional transmission circuit 10 has a problem that the output noise of amplitude control section 12 is difficult to suppress. The reason will be described below. FIG. 2 shows the configuration of amplitude control section 12 in detail. In FIG. 2, DA converter 12-1 converts amplitude data, which is a digital signal, into an analog signal. Level control section 12-2 changes the output level of DA converter 12-1 according to transmission power information P (which is oftentimes represented by digital signals) showing the magnitude of average output power of is transmission circuit 10. Buffer 12-3 amplifies the output of level control section 12-2 and outputs the result to amplification section 14. By employing such a configuration, transmission circuit 10 can change the output voltage of amplitude control section 12 and control the output level of the transmission signal outputted from amplification section 14.

Here, amplification section 14 uses a high output amplifier, which is generally called a "power amplifier," and, consequently, buffer 12-3 of amplitude control section 12 that drives amplification section 14 needs to be able to provide large current. Further, DA converter 12-1 of the amplitude control section performs DA conversion of amplitude data, which has a much wider band than IQ data used in quadrature modulation and such, and therefore requires a high-speed clock.

Therefore, when amplitude control section 12 is formed with IC chips, oftentimes, DA converter 12-1 and level control section 12-2 controlled by digital signals adopt low-voltage process that enables high-speed operations, and buffer 12-3 adopts high-voltage process that allows the use of large current.

However, generally, unlike the process that allows the use of large current, the process that enables high-speed operations has a tendency of reducing a maximum voltage. Consequently, it is difficult to increase the output amplitude, that is, it is difficult to ensure a wide dynamic range. Therefore, the gain in buffer 12-3 needs to be increased, and, as a result, there is a problem that the noise outputted from level control section 12-2 is amplified in buffer 12-3 and the output noise of amplitude control section 12 increases. The output noise of amplitude control section 12 is outputted to amplification section 14. Consequently, if noise is outputted to, in particular, the receiving band, a decrease in reception sensitivity occurs which raises a serious problem.

SUMMARY OF THE INVENTION

It is therefore an object of the present invention to provide an amplitude control circuit, polar modulation transmission circuit and polar modulation method that reduce output noise and suppress a decrease in reception sensitivity.

The amplitude control circuit of the present invention that is used in a polar modulation transmission circuit, employs a configuration having: a digital analog converter that converts amplitude data into differential amplitude signals and outputs the differential amplitude signals; a level control section that controls levels of the differential amplitude signals according to transmission power information; and an offset calculating section that assigns a DC offset based upon the transmission power information to the differential amplitude signals subjected to level control in the level control section.

The polar modulation transmission circuit of the present invention employs a configuration having: an amplitude phase extracting section that extracts amplitude data and phase data from input data; a phase modulating section that performs phase modulation based on the phase data and outputs the result as a phase modulation signal; an amplification section that amplifies the phase modulation signal based on a control voltage and outputs the amplified phase modulation signal as a transmission signal; and an amplitude control section that supplies a voltage controlled according to the amplitude data, to the amplification section as the control voltage, where the amplitude control section includes a digital analog converter that converts the amplitude data into differential amplitude signals and outputs the differential amplitude signals, a level control section that controls levels of the differential amplitude signals according to transmission power information showing an output power of the transmission signal, an offset calculating section that assigns a DC offset based upon the transmission power information to the differential amplitude signals subjected to level control in the level control section, and a differential single converting section that performs differential single conversion of the differential amplitude signals, to which the DC offset is assigned in the offset calculating section, and outputs a single-ended signal, and where the amplification section uses the single-ended signal as the control voltage.

The polar modulation method of the present invention employs a configuration having: an amplitude phase extracting step of extracting amplitude data and phase data from input data; a phase modulating step of performing phase modulation based on the phase data and outputting the result as a phase modulation signal; an amplification step of amplifying the phase modulation signal based on a control voltage and outputting the amplified phase modulation signal as a transmission signal; and an amplitude control step of supplying a voltage controlled according to the amplitude data as the control voltage, where the amplitude control step includes a converting step of converting the amplitude data into differential amplitude signals, a level control step of controlling levels of the differential amplitude signals according to transmission power information showing an output power of the transmission signal, an offset calculating step of assigning a DC offset (direct current) offset based upon the transmission power information to the differential amplitude signals subjected to level control, and a differential single converting step of performing differential single conversion of the differential amplitude signals, to which the DC offset is assigned, and outputting a single-ended signal, and where the amplification step comprises using the single-ended signal as the control voltage.

DETAILED DESCRIPTION OF THE PREFERRED EMBODIMENT

Embodiments of the present invention will be explained below in detail with reference to the accompanying drawings Embodiment 1

Figure 1:
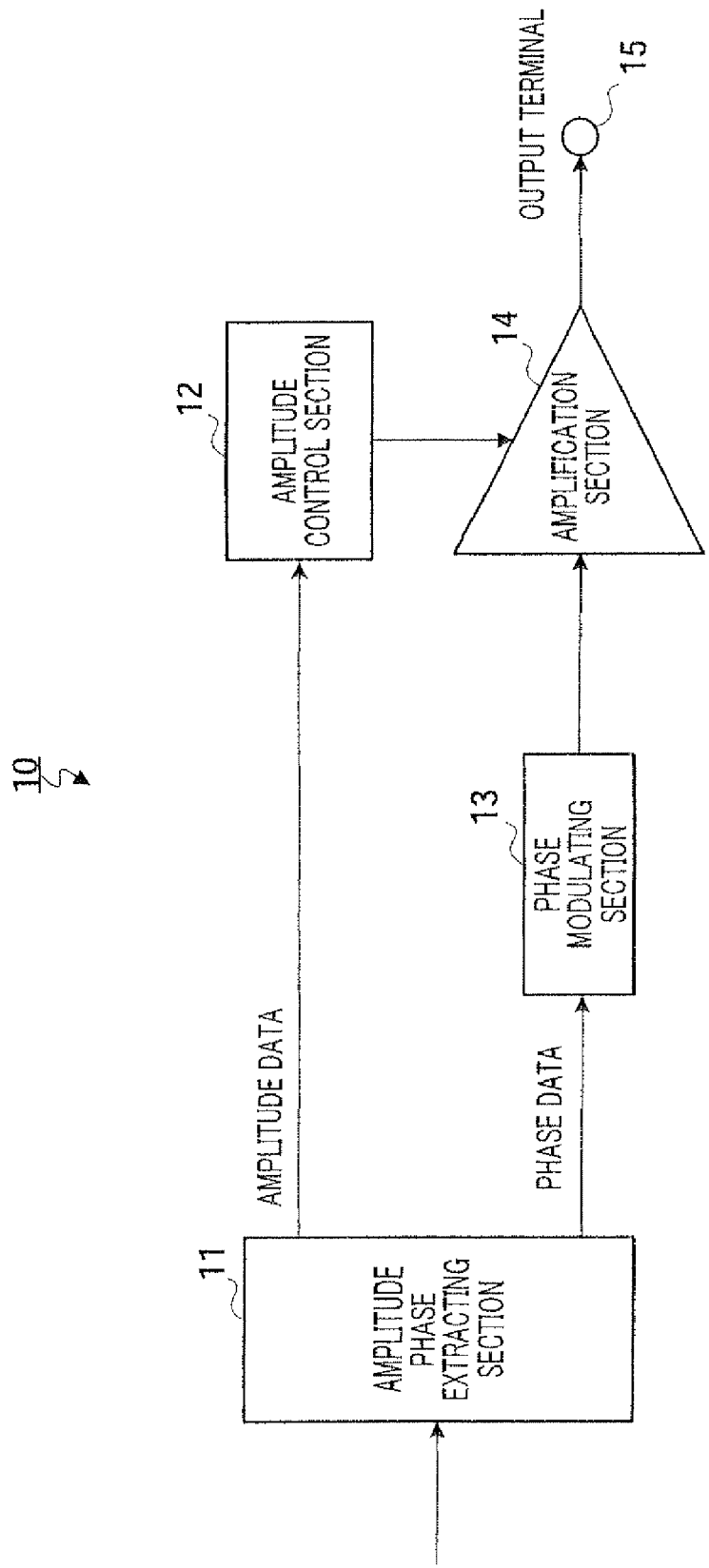
FIG. 1 is a block diagram showing a sample configuration of a conventional polar modulation circuit.
Figure 2:
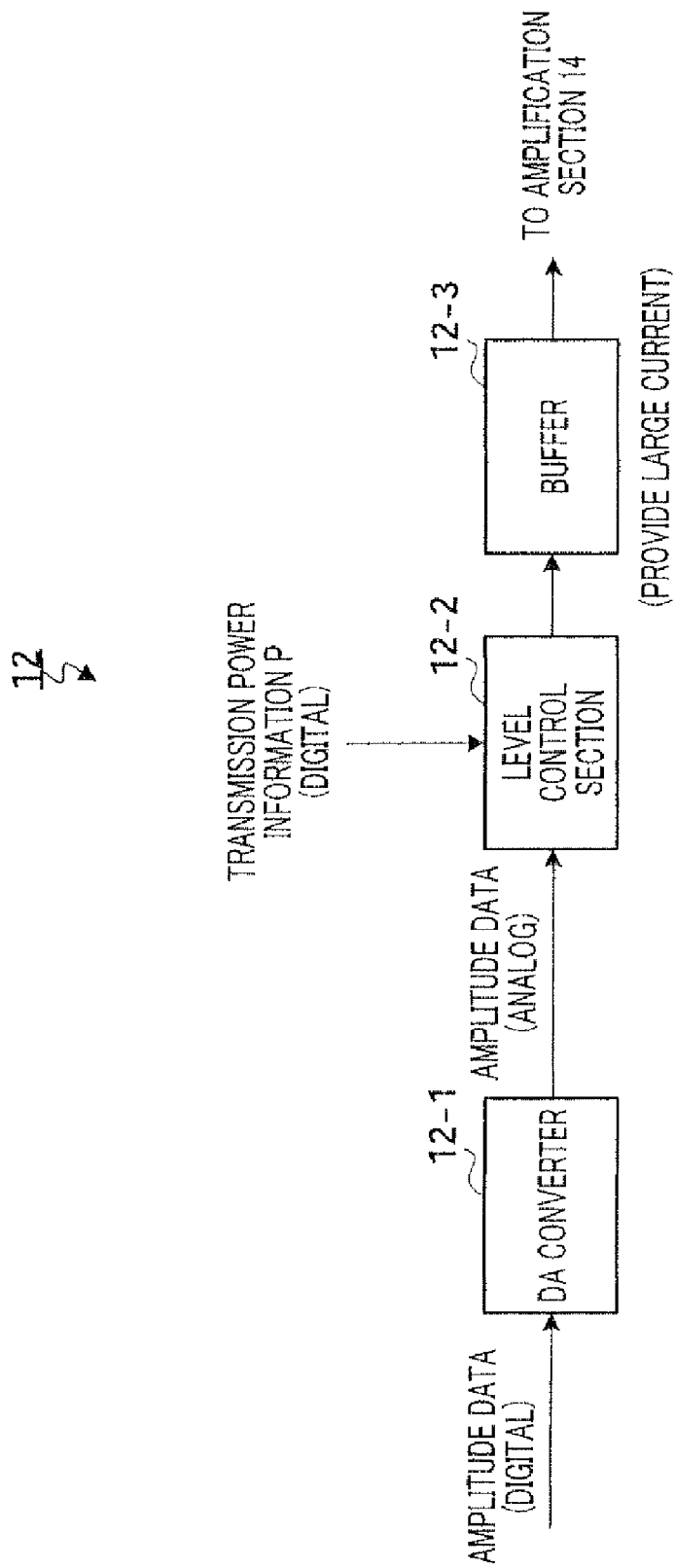
FIG. 2 shows a configuration of an amplitude control section.
Figure 3:
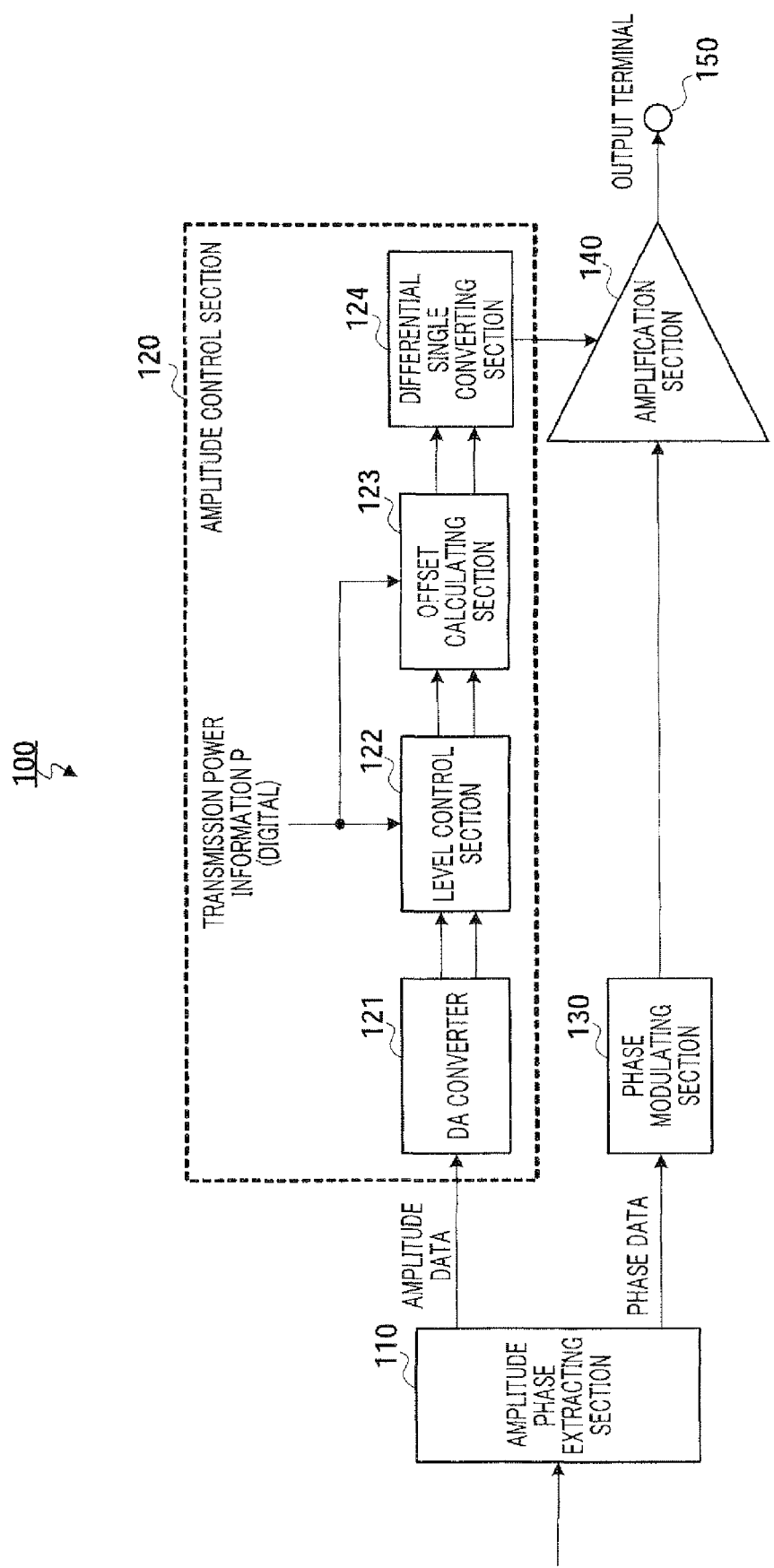
FIG. 3 is a block diagram showing a sample configuration of a polar modulation transmission circuit according to Embodiment 1 of the present invention.

FIG. 3 is a block diagram showing a sample configuration of the polar modulation transmission circuit according to Embodiment 1 of the present invention. In FIG. 3, polar modulation circuit 100 is provided with amplitude extracting section 110, amplitude control section 120, phase modulating section 130, amplification section 140 and output terminal 150.

Amplitude phase extracting section 110 receives as input modulation data (hereinafter "input data") as data to be transmitted. Amplitude phase extracting section 110 extracts the amplitude component and phase component, which are digital data, from the input data and outputs these components as amplitude data and phase data.

The amplitude data is inputted in amplitude control section 120. Amplitude control section 120 provides the voltage controlled based on the amplitude data to amplification section 140. Amplitude control section 120 will be described later in detail.

The phase data is inputted in phase modulating section 130. Phase modulating section 130 performs phase modulation based on the input phase data, and outputs the result as a phase modulation signal. The phase modulation signal is inputted in amplification section 140. Amplification section 140 amplifies the phase modulation signal according to the voltage provided from amplitude control section 120. The signal amplified in amplification section 140 is outputted from output terminal 150 as a transmission signal.

Next, amplitude control section 120 will be explained in detail. Amplitude control section 120 is provided with DA converter 121, level control section 122, offset calculating section 123 and differential single converting section 124. In amplitude control section 120, amplitude data is inputted in DA converter 121.

DA converter 121 converts the input amplitude data into analog differential signals and outputs these signals as differential amplitude signals.

The differential amplitude signals outputted from DA converter 121 are inputted in level control section 122. Further, level control section 122 receives as input transmission power information p (which is oftentimes represented by digital signals) showing the magnitude of the average output power of a transmission signal of polar modulation transmission circuit 100. Level control section 122 amplifies or attenuates the input differential amplitude signals using a gain matching the magnitude of the average output power of polar modulation transmission circuit 100 indicated by transmission power information P. Level control section 122 outputs the differential amplitude signal after amplification or attenuation to offset calculating section 123.

Offset calculating section 123 calculates a DC voltage equivalent to the difference between the amplitude outputted from level control section 122 in a case where the gain in level control section 122 is maximum and the output amplitude of level control section 122 subjected to level control based on the transmission power information (see equation 1)

$$V\text{max}-V \qquad \text{(Equation 1)}$$

Here, Vmax is the amplitude of one side (i.e. a peak to peak value) of the differential amplitude signals outputted from level control section 122 in a case where the gain in level control section 122 is maximum. Further, V is the amplitude of one side i.e. a peak to peak value) of the differential amplitude signals that are actually outputted from level control section 122 and that are subjected to level control based on the transmission power information. Further, V changes according to transmission power information P.

Further, if the maximum gain in level control section 122 is Gmax and the actual gain in level control section 122 is C, (Vmax−V) is expressed as shown in equation 2.

$$V\text{max}-V=(1-G/G\text{max})\cdot V\text{max} \qquad \text{(Equation 2)}$$

That is, if offset calculating section 123 acquires in advance the maximum gain Gmax in level control section 122 and the output amplitude Vmax a t the maximum gain Gmax, it is possible to know the amplitude V that is actually outputted from level control section 122 by learning the gain C set in level control section 122 according to transmission power information Pt so that it is possible to calculate the DC voltage to be assigned to the differential amplitude signals without monitoring the output of level control section 122. Further, actual G in level control section 122 changes according to transmission power information P. Therefore, for example, offset calculating section 123 holds the association between transmission power information P and the gain C, selects the gain G according to transmission power information P, assigns the selected gain C to equation 2 and calculates the DC voltage.

Thus, offset calculating section 123 calculates the DC voltage (Vmax−V) equivalent to the difference between the output amplitude of level control section 122 in a case where the gain in level control section 122 is maximum and the output amplitude of level control section 122 subjected to level control based on transmission power information P.

Offset calculating section 123 assigns the calculated DC voltage (Vmax−V) to the differential amplitude signals outputted from level control section 122.

The DC voltage assigned in offset calculating section 123 will be explained using FIG. 4 and FIG. 5. Further, FIG. 4 and FIG. 5 are sample figures, and the numeral values are merely examples. Further, a case will be assumed and explained below where sine waves in which the amplitude of one side 1 Vpp (peak to peak) are outputted from level control section 122 as differential amplitude signals in a case where the gain in level control section 122 is the maximum gain Gmax.

In FIG. 4 and FIG. 5, a solid line represents the positive phase signal of differential amplitude signals outputted from level control section 122 and a dotted line represents the negative phase signal of the differential amplitude signals outputted from level control section 122.

Figures 4A, 4B:
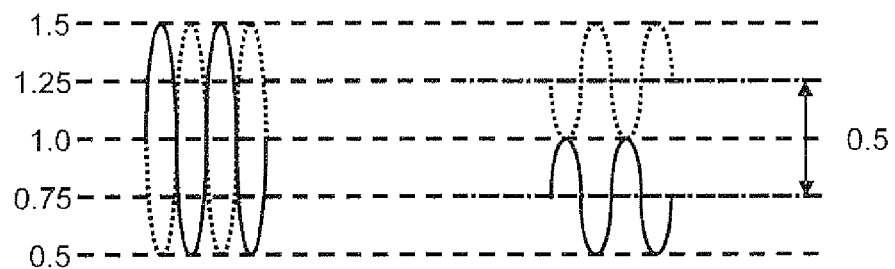
FIG. 4 illustrates a DC voltage assigned in an offset calculating section.

FIG. 4A illustrates waveforms where the gain G in level control section 122 is maximum (i.e. Gmax). FIG. 4B illustrates waveforms of differential amplitude signals assigned the DC voltage in offset calculating section 123 in a case where the gain G in level control section 122 is a half of the maximum gain Gmax.

Referring to FIG. 4B, in a case where the gain G in level control section 122 is a half of the maximum gain Gmax, differential amplitude signals of the amplitude of one side 0.5 Vpp are outputted from level control section 122. In this case, in offset calculating section 123, the DC voltage is calculated as 0.5 V using equation 2.

Further, the DC voltage is assigned to the DC voltage in offset calculating section 123 such that the positive phase signal and the negative phase signal are offset by the calculated DC voltage in parting directions. FIG. 4 illustrates an example where the positive phase signal and the negative phase signal are 0.5 V apart. Thus, the DC voltage calculated using equation 2 is assigned to the differential amplitude signals in the subtracting polarity such that the DC voltage is equivalent to the offset voltage between the positive phase signal and negative phase signal outputted from level control section 122.

Figures 5A, 5B:
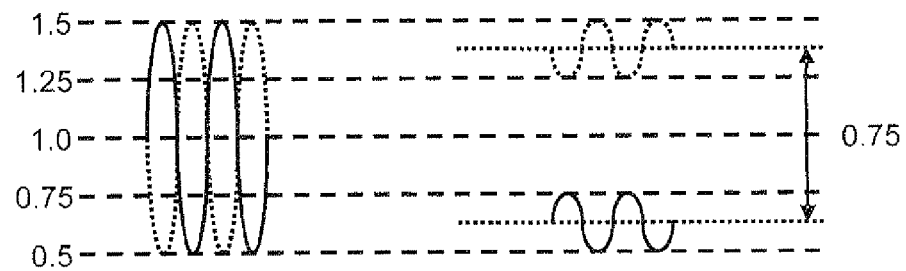
FIG. 5 illustrates a DC voltage assigned in an offset calculating section.

FIG. 5A illustrates waveforms where the gain G in level control section 122 is maximum (i.e. Gmax). FIG. 5B illustrates waveforms of differential amplitude signals assigned the DC voltage in offset calculating section 123 in a case where the gain G in level control section 122 is a quarter of the maximum gain Gmax.

Referring to FIG. 5B, in a case where the gain G in level control section 122 is a quarter of the maximum gain Gmax, differential amplitude signals of the amplitude of one side 0.25 Vpp are outputted from level control section 122. In this case, in offset calculating section 123, the DC voltage is calculated as 0.75 V using equation 2.

Further, the DC voltage is assigned to the differential amplitude signals in offset calculating section 123 such that the positive phase signal and the negative phase signal are offset by the calculated DC voltage in parting directions. FIG. 5B illustrates an example where the positive phase signal and the negative phase signal are 0.75 V apart. Thus, the DC voltage calculated using equation 2 is assigned to the differential amplitude signals in the subtracting polarity such that the DC voltage is equivalent to the offset voltage between the positive phase signal and negative phase signal outputted from level control section 122.

Figure 6:
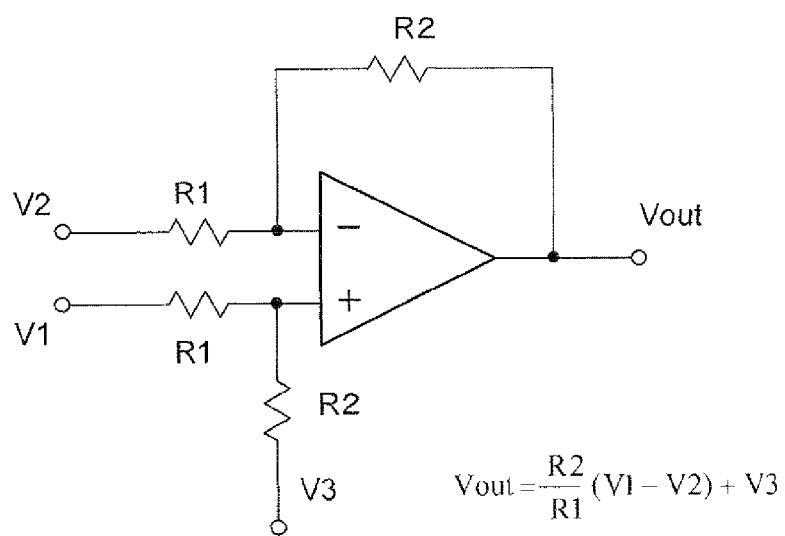
FIG. 6 shows a general circuit configuration of a differential single converting section.

The output (i.e. differential amplitude signals) of offset calculating section 123 is inputted in differential single converting section 124 and converted into a single-ended amplitude signal in differential single converting section 124. FIG. 6 illustrates a general circuit configuration of differential single converting section 124.

Differential single converting section 124 of FIG. 6 receives as input the positive phase signal and negative phase signal, and amplifies the value acquired by subtracting the negative phase signal voltage (V2) from the positive phase signal voltage (V1) by a predetermined gain (R2/R1), adds the predetermined DC voltage (V3) to the amplified value and outputs the result as a single-ended amplitude signal.

The single-ended amplitude signal is expressed by equation 3. Referring to equation 3, differential single converting section 124 converts the differential signals into a single-ended amplitude signal Vout which swings around V3.

$$Vout=(R2/R1)(V1-V2)+V3 \qquad \text{(Equation 3)}$$

Here, when V1 and V2 are assumed as sine waves, the term (R2/R1)(V1−V2) in equation 3 shows a wave that is symmetrical about the GND level (0 V which is the ground potential) between the plus and minus regions. Generally, as shown in FIG. 6, in the power supply voltage provided in differential single converting section 124, only the positive power supply voltage is used oftentimes. In this case, a voltage lower than the GND level cannot be outputted from differential single converting section 124. Therefore, unless the lower limit of the waveform of the amplitude signal outputted from differential single converting section 124 and expressed by equation 3 is not lower than the GND level, the output waveform is distorted. To prevent this, the DC voltage (V3) added in differential single converting section 124 needs to be a half of the maximum amplitude outputted from differential single converting section 124. By this means, it is possible to form the power supply voltage provided to differential single converting section 124 with positive power supply voltage alone.

Further, the external noise in level control section 122 is assigned to the positive phase signal voltage (V1) and to the negative phase signal voltage (V2) in the same polarity. Therefore, by performing conversion into a single-ended signal using equation 3 in differential single converting section 124, the external noises assigned to the positive phase signal and negative phase signal are counterbalanced and cancel each other, so that it is possible to reduce the output noise of amplitude control section 120, and, as a result, reduce the output noise of amplification section 140.

Further, compared to a case where a DA converter is used that performs D/A conversion alone without performing conversion into differential amplitude signals and that has the same number of bits as DA converter 121, it is possible to double the dynamic range of DA converter 121 and reduce the increment from the gain in differential single converting section 124 after DA converter 121, so that it is possible to prevent noise from being amplified in differential single converting section 124 and reduce the output noise of amplitude control section 120.

Figure 7A:
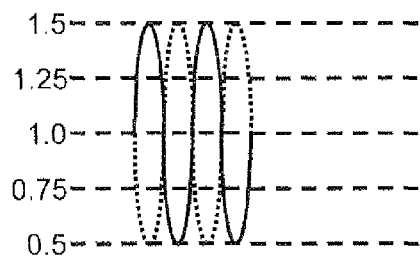
FIG. 7 illustrates output waveforms of an offset calculating section and differential single converting section.
Figure 7B:
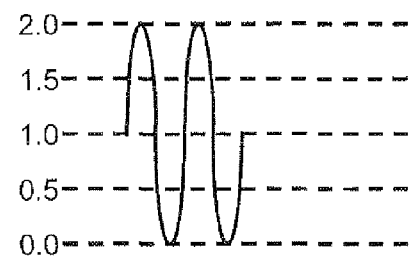
Figure 8A:
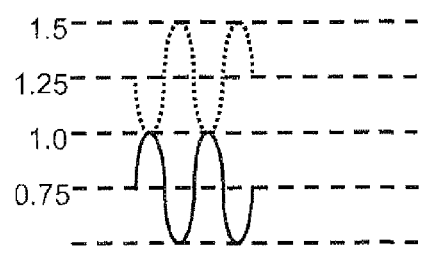
FIG. 8 illustrates output waveforms of an offset calculating section and differential single converting section.
Figure 8B:
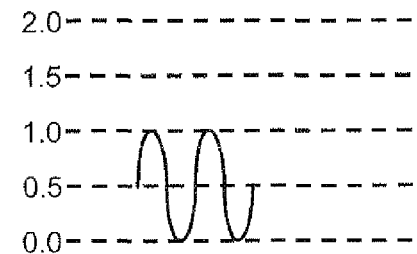

FIG. 7 and FIG. 8 illustrate output waveforms of offset calculating section 123 and differential single converting section 124 where differential amplitude signals are sine waves. FIG. 7 illustrates output the waveforms of offset calculating section 123 and differential single converting section 124 where the gain in level control section 122 is maximum, and FIG. 8 illustrates the output waveforms of offset calculating section 123 and differential single converting section 124 where the gain G in level control section 122 is a half of the maximum gain Gmax.

Further, in FIG. 7 and FIG. 8, similar to FIG. 4 and FIG. 5, the amplitude of one side of the differential amplitude signals is 1 Vpp that are outputted when the gain in level control section 122 is maximum. Further, the gain in differential single converting section 124 is one, and the predetermined DC voltage (V3) added in differential single converting section 124 is 1 V.

FIG. 7 illustrates an example where the gain in level control section 122 is maximum, and differential amplitude signals of the amplitude of one side 1 Vpp are outputted from level control section 122, and, consequently, the maximum output amplitude of differential single converting section 124 is 2 Vpp. Further, in this case, V=max holds, and, according to equation 2, the DC voltage is 0. Therefore, offset calculating section 123 outputs the differential amplitude signals as is to differential single converting section 124.

FIG. 8 illustrates an example where the gain in level control section 122 is a half of the maximum gain, and the DC voltage of 0.5 V is assigned to differential amplitude signals in offset calculating section 123. Further, as described above, offset calculating section 123 assigns the DC voltage to the differential amplitude signals in the subtracting polarity. Therefore, even in a case where the gain in level control section 122 changes, the lower limit value of the output waveform of differential single converting section 124 matches with the GND level, and, consequently, the average value of the output waveform is controlled according to the gain in level control section 122. Further, as described above, the output waveform of differential single converting section 124 is expressed by equation 3.

The gain in differential single converting section 124 is one and differential single converting section 124 assigns the DC voltage to the differential amplitude signals in the subtracting polarity, and therefore the output Vout of differential single converting section 124 is expressed as shown in equation 4.

$$Vout=V1-V2-(1-G/Gmax) \cdot Vmax+V3 \qquad \text{(Equation 4)}$$

In equation 4, the term (1−G/Gmax)·Vmax is a result of offset in offset calculating section 123 such that the offset voltage between the positive phase signal and the negative phase signal is the DC voltage in equation 2. Therefore, in offset calculating section 123, if the above-described offset processing is not performed, the output Vout of differential single converting section 124 is expressed as shown in FIG. 5.

$$Vout=V1-V2+V3 \qquad \text{(Equation 5)}$$

Here, if V1 and V2 are assumed as sine waves, the term (V1−V2) shows a wave that is symmetrical about the GND level between the plus and minus regions, and its amplitude changes according to setting of the gain G in level control section 122. Supplemental explanation will be shown below using FIG. 9.

Figure 9A:
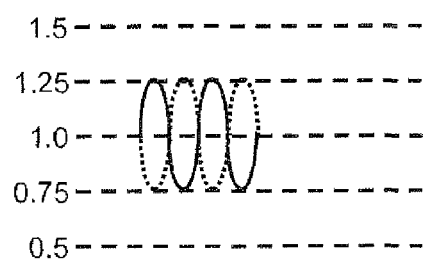
FIG. 9 illustrates output waveforms of an offset calculating section and differential single converting section in a case where offset processing is not performed in the offset calculating section.
Figure 9B:
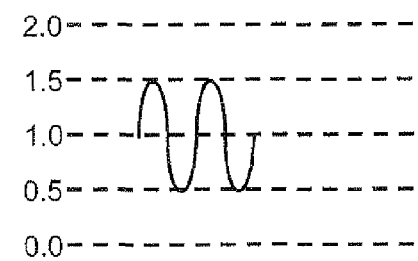

FIG. 9 illustrates output waveforms of offset calculating section 123 and differential single converting section 124 where offset processing is not performed in offset calculating section 123. Referring to FIG. 9, if offset processing is not performed in offset calculating section 123 and the gain in level control section 122 changes, the lower limit value of the output waveform of differential single converting section 124 does not match with the GND level and the average value of the output waveform is fixed.

The gain in level control section 122 is equivalent to transmission power information P showing the magnitude of the average output power of a transmission signal of polar modulation transmission circuit 100, and the gain G in level control section 122 changes according to transmission power information P. Therefore, in a case where the average value of the output waveform of differential single converting section 124 is constant when the gain G in level control section 122 changes, it means that power control is not performed.

Further, by adjusting the value of the DC voltage (V3) according to the gain G in level control section 122 such that the lower limit value of an output signal of differential single converting section 124 matches with the GND level, it is possible to perform power control without performing offset processing in offset calculating section 123.

However, according to a decrease of the gain in level control section 122, the DC voltage (V3) assigned in differential single converting section 124 decreases. Consequently, when the DC voltage (V3) approaches GND, the elements forming the circuit, where the DC voltage (V3) is generated, do not have sufficient DC bias, and therefore the accuracy of DC voltage (V3) is degraded. Thus, adjustment of the value of the DC voltage (V3) has a limit, and therefore accuracy of power control may be degraded.

On the other hand, according to the present embodiment, by performing the above-noted offset processing in offset calculating section 123, if the gain C in level control section 122 changes, the term (1−G/max)·Vmax in equation 4 changes, so that it is possible to match the lower limit value of an output signal of differential single converting section 124 with the GND level. That is, by performing offset processing in offset calculating section 123, the DC voltage (V3) needs not be adjusted. That is, according to the present embodiment, by assigning the DC voltage (Vmax−V) to differential amplitude signals, it is possible to avoid adjusting the DC voltage (V3). Further, if the accuracy of the DC voltage (Vmax−V) as the difference voltage is ensured, the accuracy of power control is ensured, so that it is possible to improve the accuracy of power control compared to a case where the DC voltage (V3) is adjusted.

As described above, according to the present embodiment, amplitude control section 120 is provided with: DA converter 121 that converts amplitude data into differential amplitude signals and outputs the differential amplitude signals; level control section 122 that controls the levels of the differential amplitude signals; and offset calculating section 123 that assigns the DC voltage based upon transmission power information P to the differential amplitude signals subjected to level control in level control section 122. By this means, in differential single converting section 124 after offset calculating section 123, by performing conversion into a single-ended signal using equation 3, noises assigned to the positive phase signal and the negative phase signal are counterbalanced and cancel each other, so that it is possible to reduce the output noise of amplitude control section 120, and, as a result, reduce the output noise of amplification section 140.

Further, compared to a case where a DA converter is used that performs D/A conversion alone without performing conversion into differential amplitude signals and that has the same number of bits as DA converter 121, it is possible to double the dynamic range of DA converter 121 and reduce the increment from the gain in differential single converting section 124 after DA converter 121, so that it is possible to prevent noise from being amplified in differential single converting section 124 and reduce the output noise of amplitude control section 120, and, as a result, reduce the output noise of amplification section 140.

Further, in polar modulation transmission circuit 100, offset calculating section 123 assigns a DC voltage equivalent to the difference between the output amplitude of level control section 122 where the gain in level control section 122 is maximum and the output amplitude of level control section 122 subjected to level control based on transmission power information P, as a DC offset, to differential amplitude signals subjected to level control in level control section 122. Consequently, even when the gain in level control section 122 changes and the levels of the differential amplitude signals change, it is possible to maintain the lower limit value of the output waveform of differential single converting section 124 and perform power control accurately according to transmission power information P without adjusting the DC voltage added in differential single converting section 124 after level control section 122.

Embodiment 2

Figure 10:
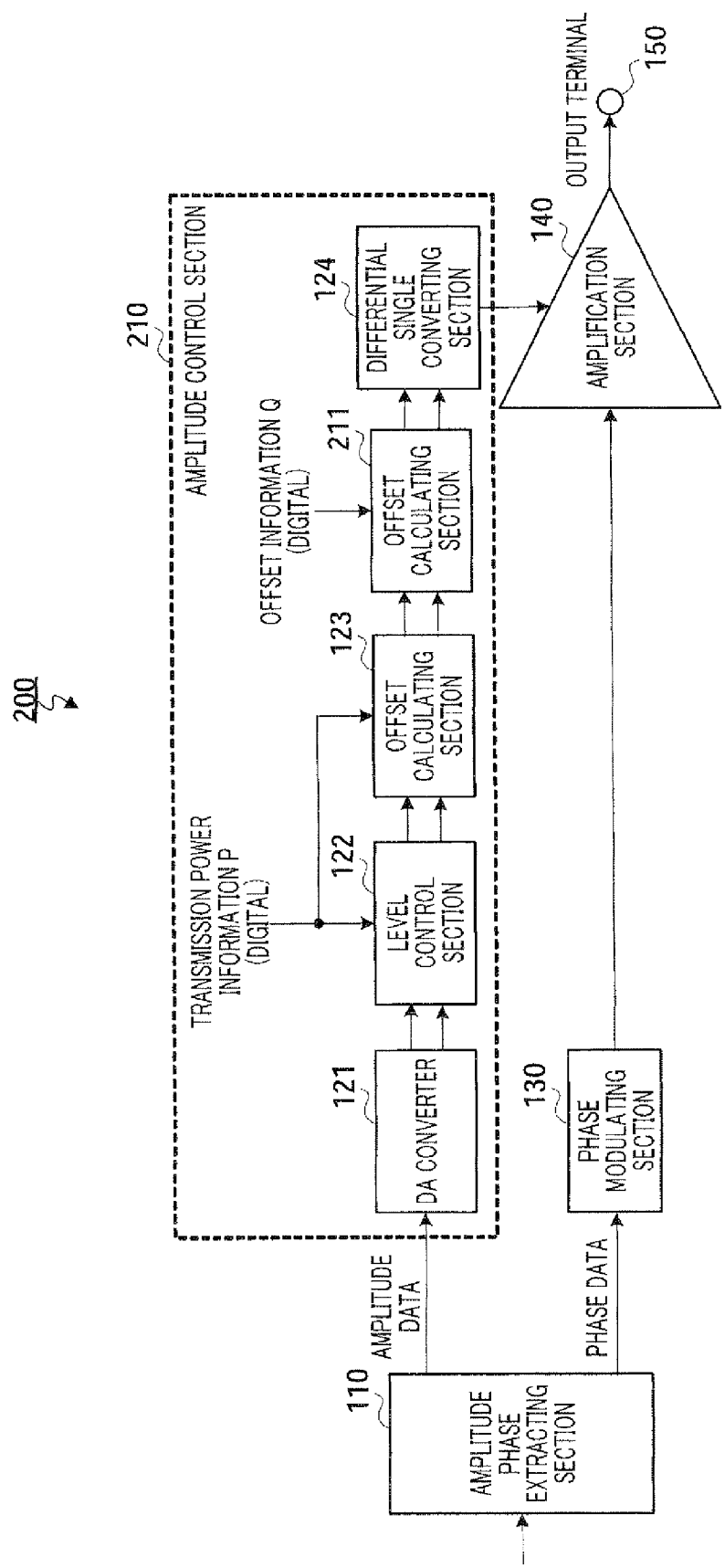
FIG. 10 is a block diagram showing a sample configuration of a polar modulation circuit according to Embodiment 2 of the present invention.

FIG. 10 is a block diagram showing a sample configuration of the polar modulation transmission circuit according to Embodiment 2 of the present invention. Polar modulation transmission circuit 200 in FIG. 10 is suitable for, in particular, a case where a power amplifier using HBT (Hetero Bipolar Transistor) is applied to amplification section 140. Further, in polar modulation transmission circuit 200 according to the present embodiment in FIG. 10, the same components as in FIG. 3 will be assigned the same reference numerals and explanation will be omitted. Polar modulation transmission circuit 200 in FIG. 10 employs a configuration replacing amplitude control section 120 with amplitude control section 210, in polar modulation transmission circuit 100 in FIG. 3.

Amplitude control section 210 employs a configuration further adding offset calculating section 211 to amplitude control section 120.

Offset calculating section 211 receives as input offset information Q (which is oftentimes represented by digital signals) showing the magnitude of the offset voltage unique to amplification section 140 (hereinafter "amplification section offset voltage"). Offset information Q is different from transmission power information P inputted in offset calculating section 123. The amplification section offset voltage will be described later.

Offset calculating section 211 assigns the amplification offset voltage to differential amplitude signals outputted from offset calculating section 123. Further, in FIG. 10, although offset calculating section 211 is provided between offset calculating section 123 and single converting section 124, no operational problem arises whether offset calculating section 211 is provided before offset calculating section 123 or after differential single converting section 124. However, if offset calculating section 211 is provided after differential converting section 124, the amplification section offset voltage is assigned to a single-ended amplitude signal.

Figure 11:
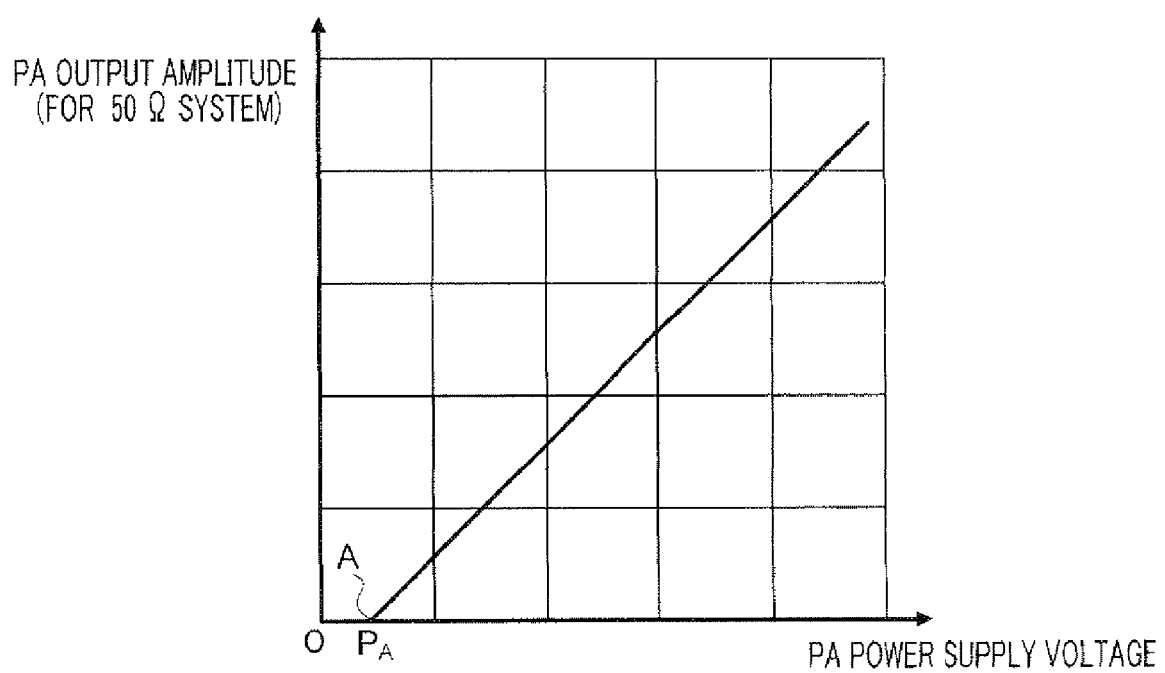
FIG. 11 illustrates an AM-AM characteristic when an amplification section is formed with a power amplifier using HBT.

Next, the amplification section voltage will be explained using FIG. 11. FIG. 11 illustrates the relationship between the power supply voltage of a power amplifier and the output voltage of the power amplifier where amplification section 140 is formed with a power amplifier using HBT. In FIG. 11, the x axis represents the power supply voltage of the power amplifier (equivalent to the output voltage from amplitude control section 210 in FIG. 10), and the y axis represents the voltage calculated as the output voltage of the power amplifier for 50Ω system. This characteristic showing the relationship between the power supply voltage and output voltage of a power amplifier is called the AM-AM (Amplitude Modulation to Amplitude Modulation) characteristic. A power amplifier, in which the AM-AM characteristic changes linearly, is suitable for a polar modulation transmission circuit.

Although the AM-AM characteristic shown in FIG. 11 changes linearly, its line intersects with the x axis at point A and yet does not pass the origin, and therefore the proportional relationship does not hold between the power supply voltage and output voltage of the power amplifier. Therefore, if an amplitude signal of a voltage value lower than the voltage $P_A$ at point A is inputted, a signal is not outputted from the power amplifier. In FIG. 11, the voltage $P_A$ at point A corresponds to the above-noted amplification section offset voltage. If the amplification section offset voltage is present, the AM-AM characteristic does not hold a proportional relationship, and, consequently, distortion occurs due to the amplification section offset voltage.

Therefore, if amplification section 140 is formed with a power amplifier using HBT having the AM-AM characteristic shown in FIG. 11, the voltage $P_A$ equivalent to the amplification section offset voltage is applied to the amplitude signal as the offset voltage, the amplitude signal is shifted by the voltage $P_A$, and then the amplitude signal needs to be inputted in the power supply voltage of amplification section 140.

The amplification section offset voltage varies depending on process variation, temperature and such. Therefore, it is preferable to adjust the amplification section offset voltage adequately. According to the present embodiment, offset calculating section 211 adjusts the amplification section offset voltage and assigns this adjusted amplification section offset voltage to differential amplitude signals outputted from offset calculating section 123. The amplification section offset voltage will be explained below in detail using FIG. 12 and FIG. 13.

Figure 12:
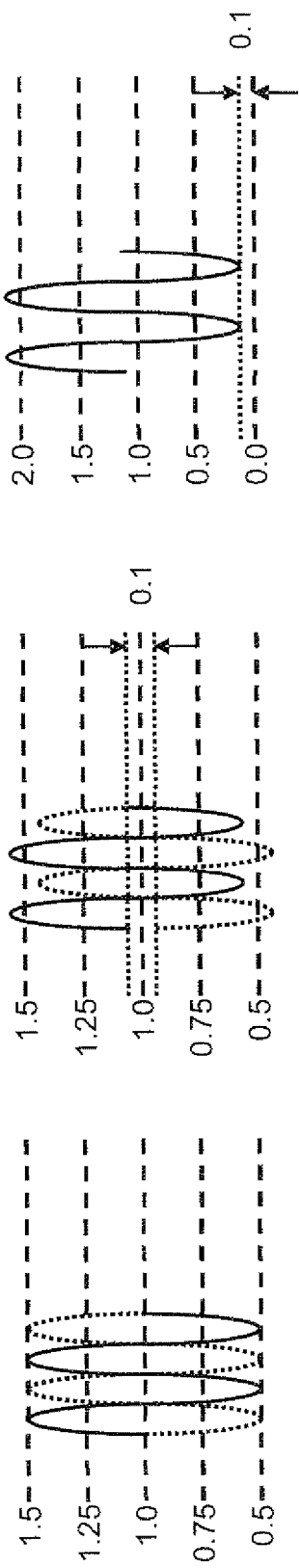
FIG. 12 illustrates output waveforms of an offset calculating section, offset calculating section and differential single converting section in a case where differential amplitude signals are sine waves, the gain in a level control section is maximum and the amplification section offset voltage is 0.1 V.

FIG. 12 illustrates the output waveforms of offset calculating section 123 (FIG. 12A), the output waveforms of offset calculating section 211 (FIG. 12B) and the output waveform of differential single converting section 124 (FIG. 12C), where the differential amplitude signals are sine waves, the gain in level control section 122 is maximum and the amplification section offset voltage is 0.1 V.

Figure 13:
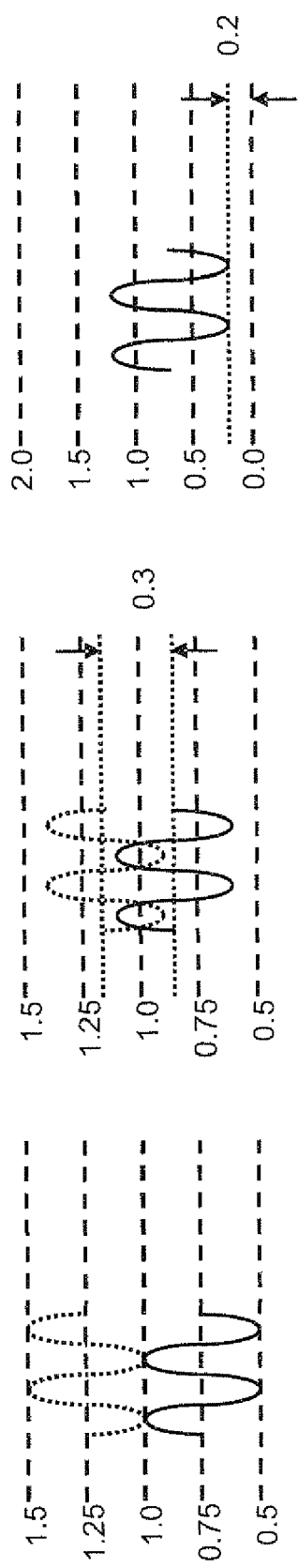
FIG. 13 illustrates output waveforms of an offset calculating section, offset calculating section and differential single converting section in a case where differential amplitude signals are sine waves, the gain in a level control section is a half of the maximum value and the amplification section offset voltage is 0.2 V.

Further, FIG. 13 illustrates the output waveforms of offset calculating section 123 (FIG. 13A), the output waveforms of offset calculating section 211 (FIG. 13B) and the output waveform of differential single converting section 124 (FIG. 13C), where the differential amplitude signals are sine waves, the gain in level control section 122 is a half of the maximum gain and the amplification section offset voltage is 0.2 V.

Further, similar to FIG. 4, FIG. 12 and FIG. 13 illustrate output waveforms where the amplitude of one side of differential amplitude signals is 1 Vpp that are outputted when the gain in level control section 122 is maximum or where the gain in differential single converting section 124 is one and the predetermined DC voltage (V3) to be added is 1 V.

FIG. 12 illustrates an example where the gain in level control section 122 is maximum, and differential amplitude signals of the amplitude of one side 1 Vpp are outputted from level control section 122, and therefore the maximum output amplitude of differential single converting section 124 is 2 Vpp. Further, in this case, V=Vmax holds, and, consequently, the DC voltage is 0 according to equation 2. Therefore, offset calculating section 123 outputs the differential signals as is to offset calculating section 211 (see FIG. 12A). Offset calculating section 211 assigns the amplitude section offset voltage 0.1 V to the differential amplitude signals. The amplification section offset voltage 0.1 V is based upon offset information Q. Further, referring to FIG. 12B, the DC voltage (amplification section offset voltage) based upon offset information Q is assigned to the differential amplitude signals in the adding polarity. The differential amplitude signals assigned the amplification section offset voltage 0.1 V is converted into a single-ended signal in differential single converting section 124. Referring to FIG. 12C, the single-ended signal inputted in amplification section 140 is offset by the amplification section offset voltage. By this means, it is possible to prevent occurrence of amplification distortion.

FIG. 13 illustrates an example where the gain in level control section 122 is a half of the maximum gain, and differential amplitude signals of the amplitude of one side 1 Vpp are outputted from level control section 122, and therefore the maximum output amplitude of differential single converting section 124 is 1 Vpp. If the gain in level control section 122 is a half of the maximum gain, V=Vmax/2 holds, and, according to equation 2, the DC voltage is 0.5 V. Therefore, offset calculating section 123 assigns the amplification section offset voltage 0.5 V to the differential amplitude signals and outputs the resulting differential amplitude signals to offset calculating section 211 (see FIG. 13A). Further, referring to FIG. 13B, the DC voltage (amplification section offset voltage) based upon offset information Q is assigned to the differential amplitude signal in the adding polarity. The differential amplitude signals assigned the amplification section offset voltage 0.2 V are converted into a single-ended signal in differential single converting section 124. Referring to FIG. 13C, the single-ended signal inputted in amplification section 140 is offset by the amplification section offset voltage. By this means, it is possible to prevent occurrence of amplification distortion.

As described above, according to the present embodiment, offset calculating section 211 can assign the amplification section offset voltage in amplification section 140 to differential amplitude signals outputted from offset calculating section 123, so that it is possible to adjust the offset voltage in amplification section 140 and compensate the offset voltage in advance even when the offset voltage that is unique to amplification section 140 changes, thereby preventing occurrence of distortion due to the offset voltage.

Embodiment 3

Figure 14:
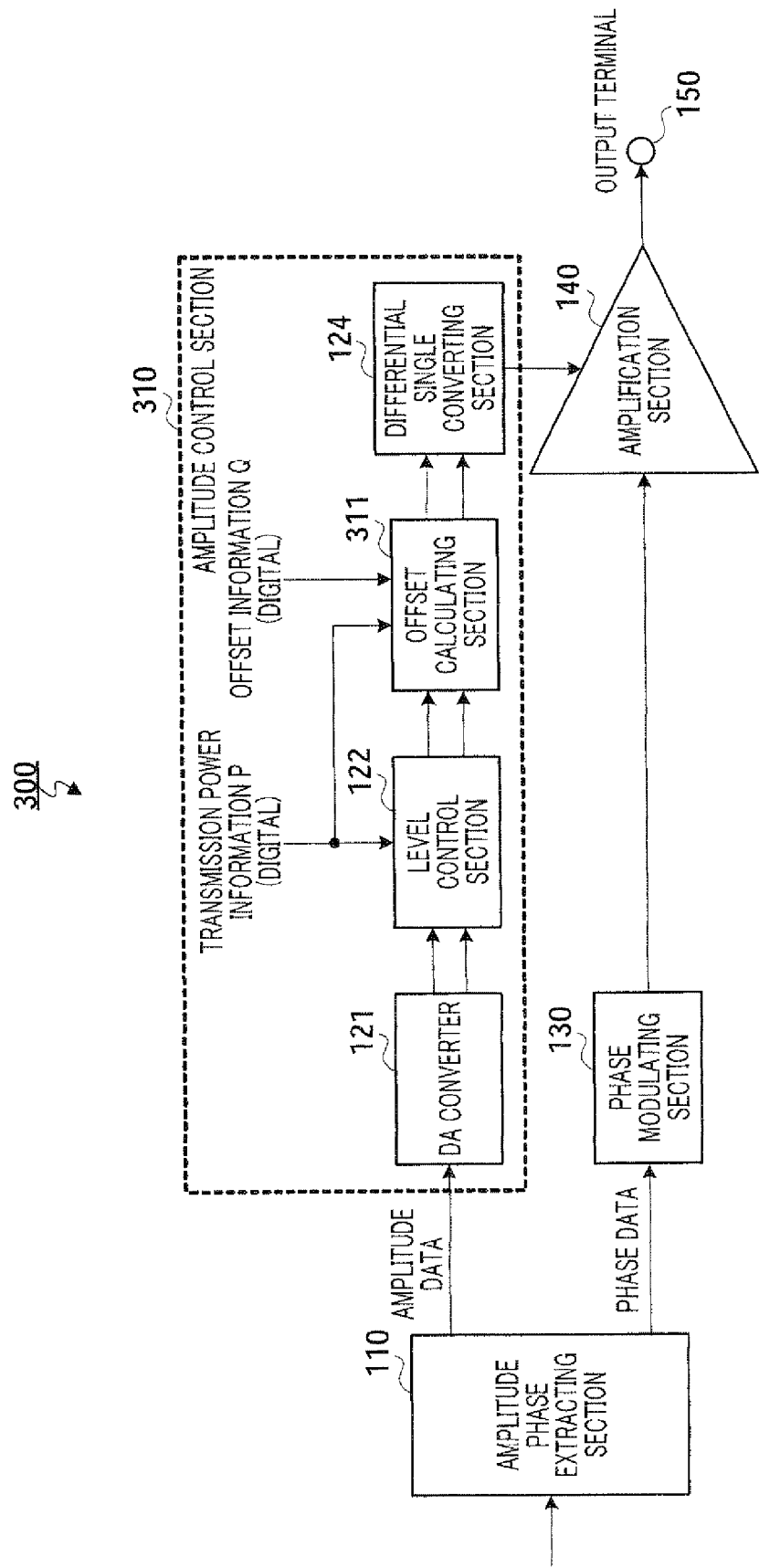
FIG. 14 is a block diagram showing a sample configuration of a polar modulation transmission circuit according to Embodiment 3 of the present invention.

FIG. 14 is a block diagram showing a sample configuration of the polar modulation transmission circuit according to Embodiment 3 of the present invention. For polar modulation transmission circuit 300 in FIG. 14 the same components as in FIG. 3 will be assigned the same reference numerals and explanation will be omitted. Polar modulation transmission circuit 300 in FIG. 14 employs a configuration replacing amplitude control section 120 with amplitude control section 310 in polar modulation transmission circuit 100 in FIG. 3.

Amplitude control section 310 employs a configuration replacing offset calculating section 123 with offset calculating section 311 in amplitude control section 120.

Offset calculating section 311 receives as input offset information Q showing the magnitude of an offset (amplification section offset voltage) unique to amplification section 140 in addition to transmission power information p showing the magnitude of the average output power of a transmission signal of polar modulation transmission circuit 300, and is controlled by these information.

To be more specific, offset calculating section 311 calculates a total voltage of a DC voltage based upon transmission power information P and a DC voltage based upon offset information Q, from transmission power information P and offset information Q. Further, offset calculating section 311 assigns the calculated total voltage to differential amplitude signals outputted from level control section 122. This will be explained below with reference to FIG. 12 again.

FIG. 12 illustrates a case where the gain in level control section 122 is maximum. Therefore, the DC voltage based upon transmission power information P is zero (see FIG. 12A). On the other hand, the amplification section offset is 0.1 V, and, consequently, the DC voltage based upon offset information Q is 0.1 V and is assigned to differential amplitude signals in the adding polarity (see FIG. 12B). Therefore, the magnitude of the total DC voltage is 0.1 V (|−0+0.1|V) and assigned to differential amplitude signals in the adding polarity (see FIG. 12C).

Further, in FIG. 13, the gain in level control section 122 is a half of the maximum gain Gmax. Therefore, the DC voltage based upon transmission power information P is 0.5 V and is assigned to differential amplitude signals in the subtracting polarity (see FIG. 13A). On the other hand, the amplification section offset is 0.2 V, and, consequently, the DC voltage based upon offset information Q is 0.2 V and is assigned to the differential amplitude signals in the adding polarity (see FIG. 13B). Therefore, the magnitude of the total DC voltage is 0.3 V (|−0.5+0.2|V) and is assigned to the differential amplitude signals in the subtracting polarity (see FIG. 13C).

That is, while a configuration is employed where offset calculating section 123 based upon transmission power information P and offset calculating section 211 based upon offset information Q are provided individually in Embodiment 2, according to the present embodiment, by calculating in advance a total voltage of a DC voltage based upon transmission power information P and a DC voltage based upon offset information Q, as shown in FIG. 14, it is possible to employ a configuration where only one offset calculating section of offset calculating section 311 is provided.

As described above, transmission power information P and offset information Q are represented by digital signals oftentimes. Therefore, compared to a case where offset calculations are performed in two sections like Embodiment 2, according to Embodiment 3, by calculating the DC voltage assigned in offset calculating section 311 from transmission power information P and offset information Q, it is possible to reduce the circuit scale, and, furthermore, improve output accuracy.

As described above, according to the present embodiment, offset calculating section 311 assigns a voltage to differential amplitude signals as a DC offset, where the voltage reflects a DC voltage that is equivalent to the offset voltage in amplification section 140, upon a DC voltage that is equivalent to the difference between the output amplitude of level control section 122 when the gain in level control section 122 is maximum and the output amplitude of level control section 122 subjected to level control based on transmission power information. By this means, compared to Embodiment 2, it is possible to reduce the circuit scale and improve output accuracy.

Although an exemplification of preferred embodiment of the present invention has been described above, the scope of the present invention is not limited to this. The present invention can be implemented in various embodiments in a range not departing from the scope of the invention.

The amplitude control circuit, polar modulation transmission circuit and polar modulation method according to the present invention can suppress a decrease in reception sensitivity, and is suitable for, for example, mobile telephones and communication devices using wireless LAN and such.

What is claimed is:

1. An amplitude control circuit that is used in a polar modulation transmission circuit, comprising:
   a digital analog converter that converts amplitude data into differential amplitude signals and outputs the differential amplitude signals;
   a level control section that controls levels of the differential amplitude signals according to transmission power information; and
   an offset calculating section that assigns a DC offset based upon the transmission power information to the differential amplitude signals subjected to level control in the level control section,
   wherein the offset calculating section assigns, as the DC offset, a DC voltage equivalent to a difference between an output amplitude of the level control section in a case where a gain in the level control section is maximum and an output amplitude of the level control section subjected to the level control based on the transmission power information, to the differential amplitude signals subjected to the level control in the level control section.

2. A polar modulation transmission circuit comprising:
   an amplitude phase extracting section that extracts amplitude data and phase data from input data;
   a phase modulating section that performs phase modulation based on the phase data and outputs the result as a phase modulation signal;
   an amplification section that amplifies the phase modulation signal based on a control voltage and outputs the amplified phase modulation signal as a transmission signal; and
   an amplitude control section that supplies a voltage controlled according to the amplitude data, to the amplification section as the control voltage, wherein:
   the amplitude control section corn rises:
      a digital analog converter that converts the amplitude data into differential amplitude signals and outputs the differential amplitude signals;
      a level control section that controls levels of the differential amplitude signals according to transmission power information showing an output power of the transmission signal;
      an offset calculating section that assigns a DC offset based upon the transmission power information to the differential amplitude signals subjected to level control in the level control section; and
      a differential signal converting section that performs differential signal conversion of the differential amplitude signals to which the DC offset is assigned in the offset calculating section, and outputs a single-ended signal; and
   the amplification section uses the single-ended signal as the control voltage,
   wherein the offset calculating section assigns, as the DC offset, a DC voltage equivalent to a difference between an output amplitude of the level control section in a case where a gain in the level control section is maximum and an output amplitude of the level control section subjected to level control based on the transmission power information, to the differential amplitude signals subjected to the level control in the level control section.

3. A polar modulation transmission circuit comprising:
   an amplitude phase extracting section that extracts amplitude data and phase data from input data;
   a phase modulating section that performs phase modulation based on the phase data and outputs the result as a phase modulation signal;
   an amplification section that amplifies the phase modulation signal based on a control voltage and outputs the amplified phase modulation signal as a transmission signal; and
   an amplitude control section that supplies a voltage controlled according to the amplitude data, to the amplification section as the control voltage, wherein:
   the amplitude control section comprises:
      a digital analog converter that converts the am litude data into differential amplitude signals and outputs the differential amplitude signals;
      a level control section that controls levels of the differential amplitude signals according to transmission power information showing an output power of the transmission signal;

an offset calculating section that assigns a DC offset based upon the transmission power information to the differential amplitude signals subjected to level control in the level control section; and a differential signal converting section that performs differential signal conversion of the differential amplitude signals, to which the DC offset is assigned in the offset calculating section, and outputs a single-ended signal; and the amplification section uses the single-ended signal as the control voltage, wherein:

the offset calculating section further comprises a first offset calculating section and a second offset calculating section;

the first offset calculating section assigns to the differential amplitude signals, as the DC offset, a DC voltage equivalent to a difference between an output amplitude of the level control section when a gain in the level control section is maximum and an output amplitude of the level control section subjected to level control based on the transmission power information; and the second offset calculating section calculates a DC voltage equivalent to an offset voltage in the amplification section according to offset voltage information showing an offset voltage in the amplification section, and assigns the DC voltage to the differential amplitude signals as the DC offset.

4. A polar modulation transmission circuit comprising:

an amplitude phase extracting section that extracts amplitude data and phase data from input data;

a phase modulating section that performs phase modulation based on the phase data and outputs the result as a phase modulation signal;

an amplification section that amplifies the phase modulation signal based on a control voltage and outputs the amplified phase modulation signal as a transmission signal; and an amplitude control section that supplies a voltage controlled according to the amplitude data, to the amplification section as the control voltage, wherein:

the amplitude control section comprises:

a digital analog converter that converts the amplitude data into differential amplitude signals and outputs the differential amplitude signals;

a level control section that controls levels of the differential amplitude signals according to transmission power information showing an output power of the transmission signal;

an offset calculating section that assigns a DC offset based upon the transmission power information to the differential amplitude signals subjected to level control in the level control section; and a differential signal converting section that performs differential signal conversion of the differential amplitude signals, to which the DC offset is assigned in the offset calculating section, and outputs a single-ended signal; and the amplification section uses the single-ended signal as the control voltage, wherein the offset calculating section assigns a voltage to the differential amplitude signals as the DC offset, the voltage reflecting a DC voltage that is equivalent to an offset voltage in the amplification section, upon a DC voltage that is equivalent to a difference between an output amplitude of the level control section when a gain in the level control section is maximum and an output amplitude of the level control section subjected to level control based on the transmission power information.

\* \* \* \* \*